United States Patent [19]

Yamaura et al.

[11] Patent Number: 4,695,931
[45] Date of Patent: Sep. 22, 1987

[54] VOLTAGE/FREQUENCY CONVERTER WITH FREQUENCY DRIFT COMPENSATION LOOP

[75] Inventors: Mitsuru Yamaura; Norio Fujisawa, both of Tokyo, Japan

[73] Assignee: Kabushiki Kaisha Toshiba, Kawasaki, Japan

[21] Appl. No.: 867,929

[22] Filed: May 29, 1986

[30] Foreign Application Priority Data

Jun. 3, 1985 [JP] Japan ............................... 60-118778

[51] Int. Cl.$^4$ ............................................. H03L 7/00
[52] U.S. Cl. ........................................ 363/8; 331/1 A; 331/18
[58] Field of Search ............................ 363/8, 157, 165; 331/1 R, 1 A, 18, 23, 25, 27; 332/19

[56] References Cited

U.S. PATENT DOCUMENTS

| | | | |
|---|---|---|---|
| 3,651,422 | 3/1972 | Underhill | 331/18 X |
| 3,753,141 | 8/1973 | Van Elk et al. | 331/18 X |
| 4,147,910 | 4/1979 | Kiuchi et al. | 363/165 X |
| 4,387,351 | 6/1983 | Furiga et al. | 331/18 X |
| 4,470,025 | 9/1984 | Baker | 331/1 A X |
| 4,520,327 | 5/1985 | Myers | 331/1 R X |

OTHER PUBLICATIONS

"Electronic Technology on the Workshop", Sep. 1981, M. Kamiya, I. Kouda, pp. 14, 15.

Primary Examiner—Peter S. Wong
Assistant Examiner—Marc S. Hoff
Attorney, Agent, or Firm—Oblon, Fisher, Spivak, McClelland & Maier

[57] ABSTRACT

A voltage/frequency converter is formed of a V/F converter circuit which converts an input potential into a frequency corresponding to the instantaneous value of the input potential, and a difference detection circuit which generates an output corresponding to the difference between the output frequency of the V/F converter circuit and a predetermined reference frequency. The V/F converter circuit is controlled according to the level of the output from the difference detection circuit, thereby reducing the deviation of the output frequency of said V/F converter circuit from the reference frequency.

22 Claims, 51 Drawing Figures

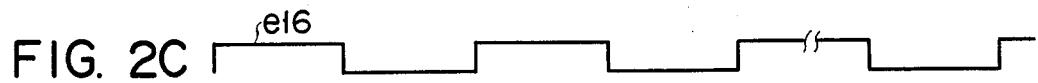
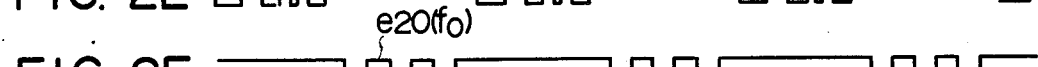
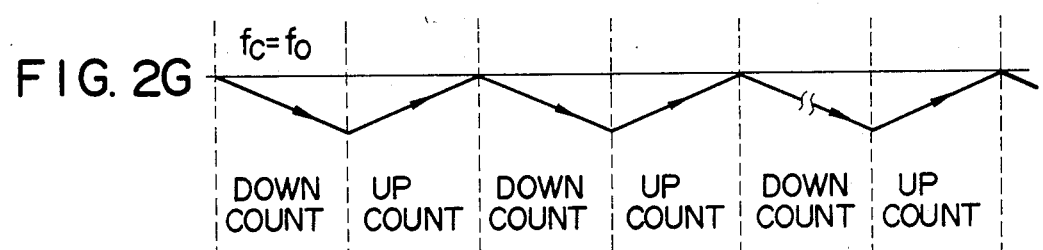
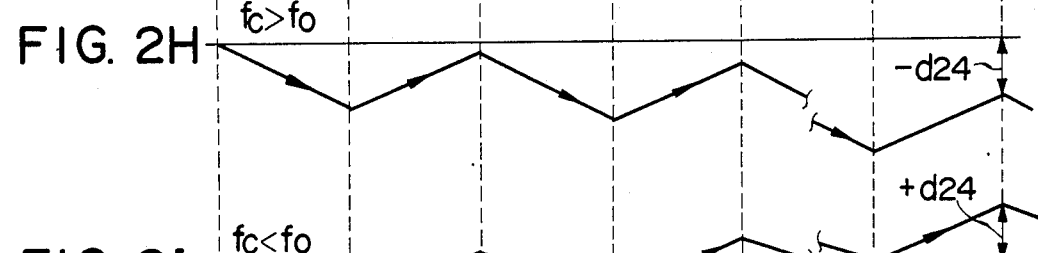
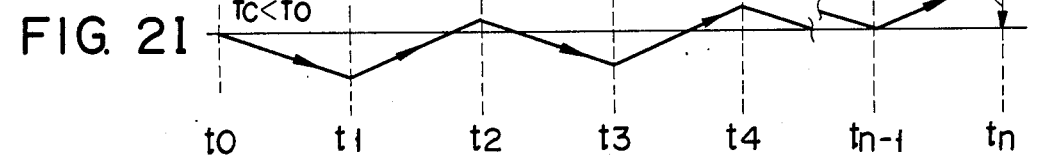

F I G. 6A
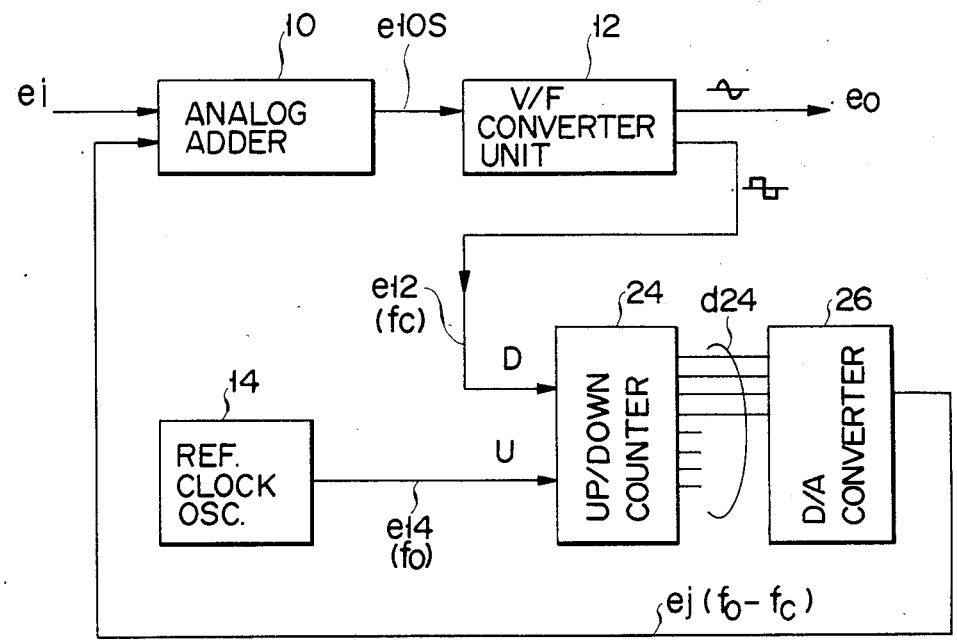

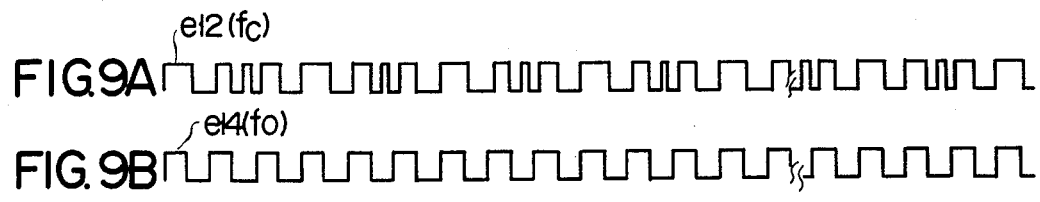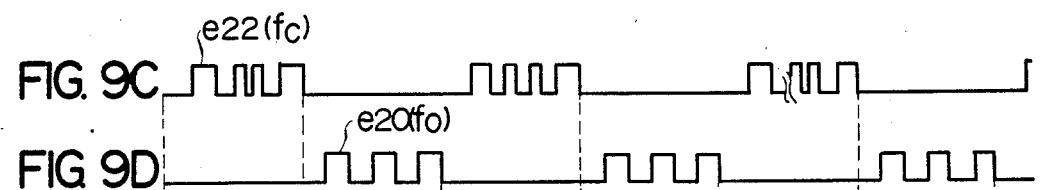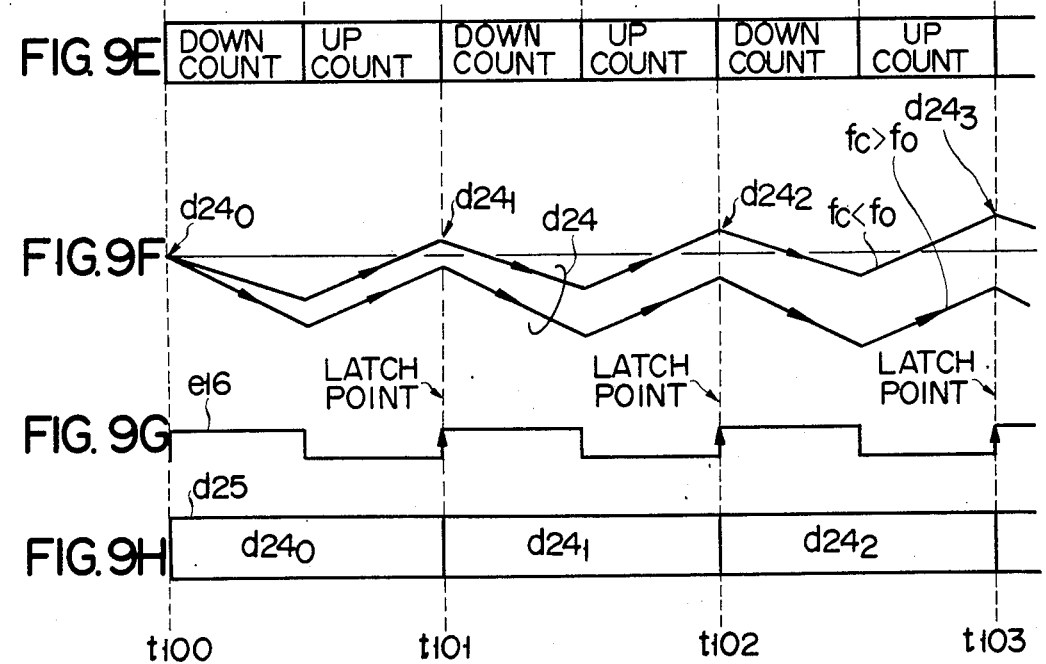

F I G. 12
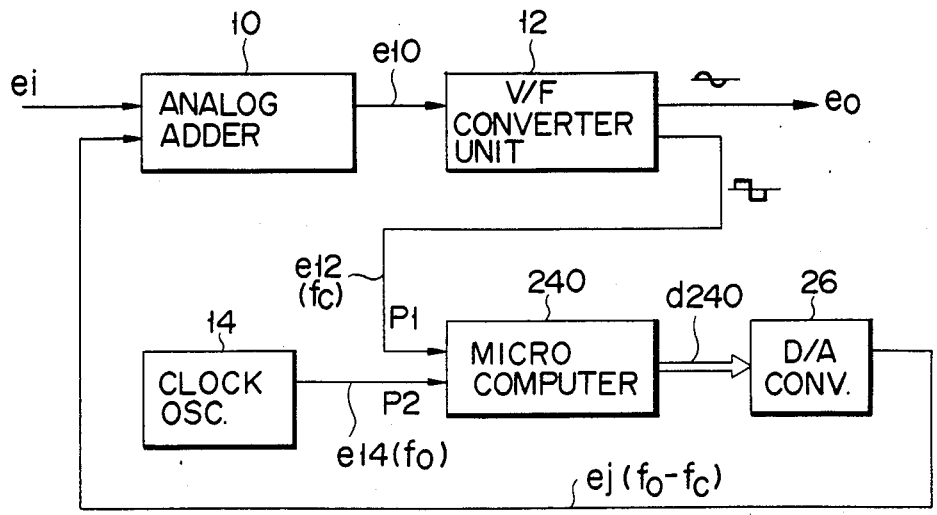
F I G. 13A
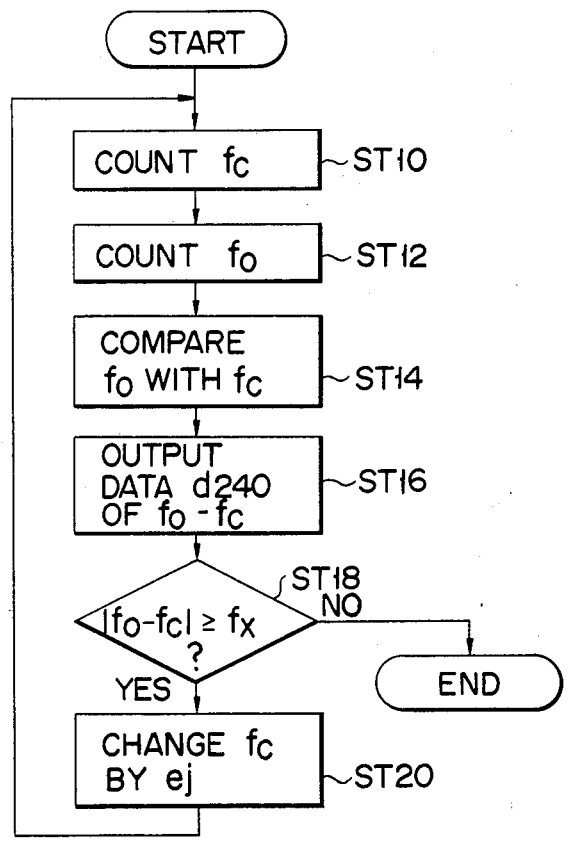

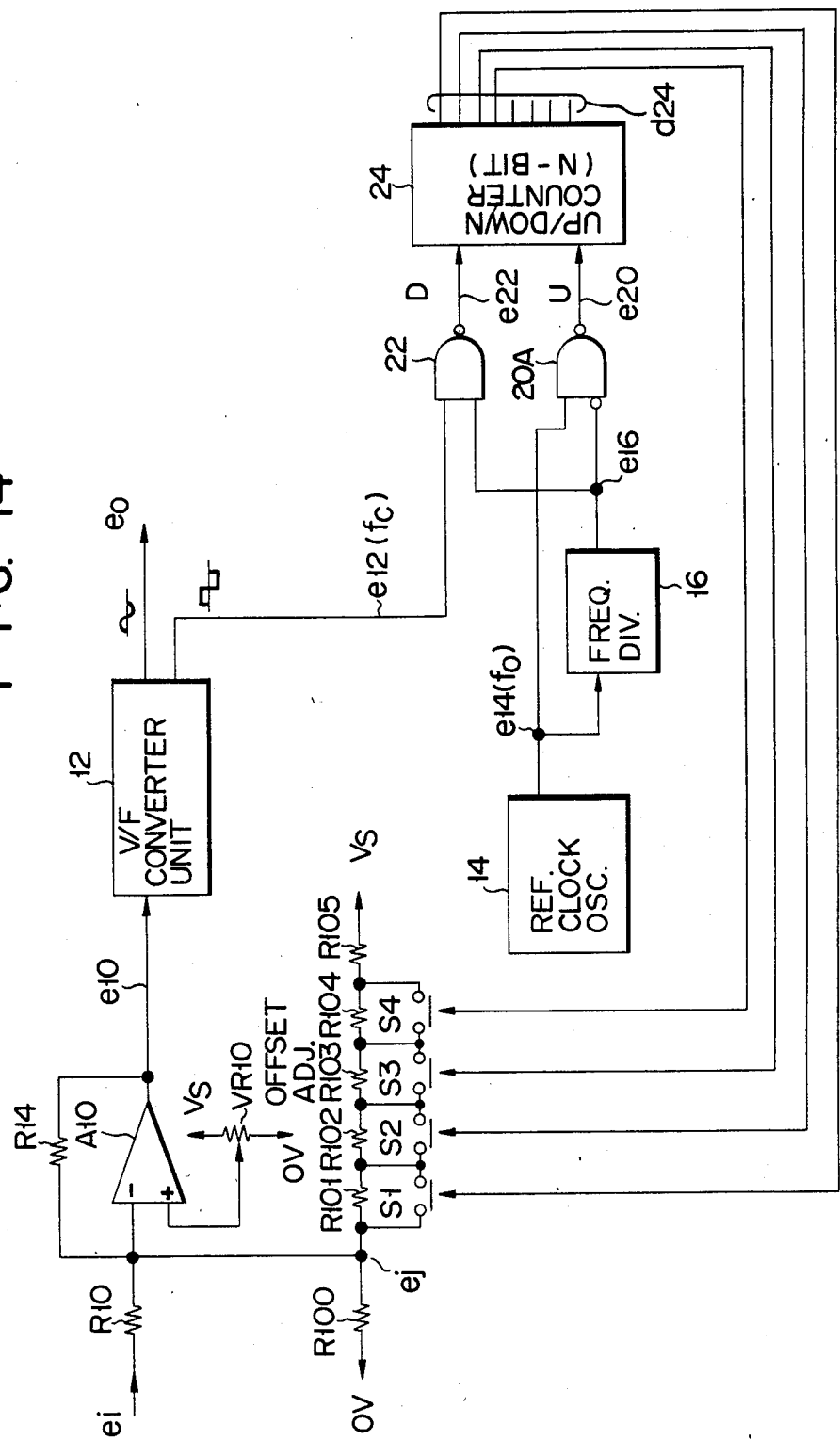
F I G. 14

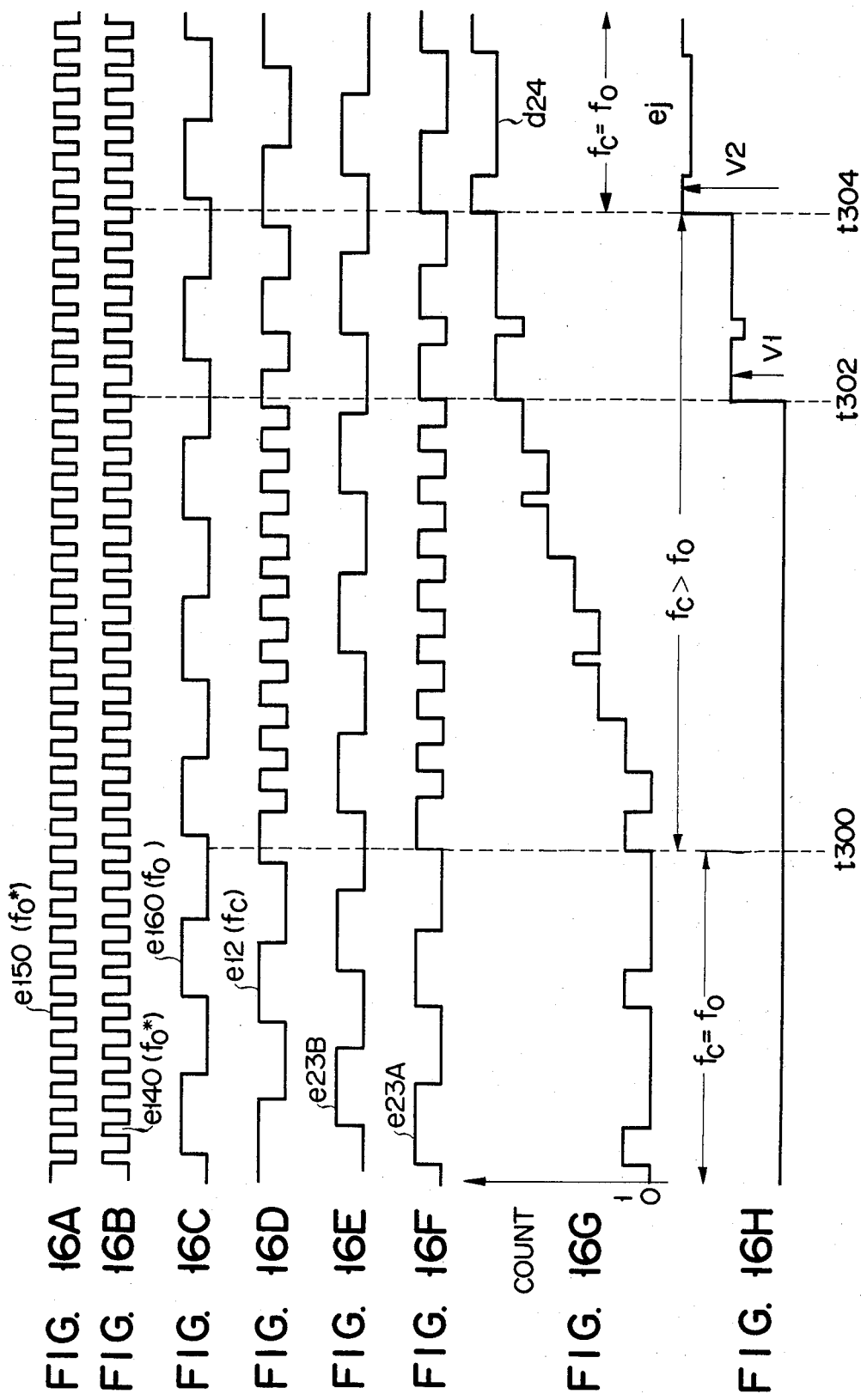

VOLTAGE/FREQUENCY CONVERTER WITH FREQUENCY DRIFT COMPENSATION LOOP

BACKGROUND OF THE INVENTION

The present invention generally relates to a voltage/frequency converter (hereinafter referred to as V/F converter) for converting the instantaneous value of an input potential into frequency information.

In a frequency modulation system, the frequency of a carrier wave is modulated by the instantaneous value of an input potential and the modulated carrier wave is transmitted to a remote place. In such a modulation system, the carrier frequency is increased with increase of the present value of the input potential and reduced with reduction thereof. Although various types of frequency modulation systems have been known, either of these systems basically have an input/output characteristic as shown in FIG. 4.

As will be seen from FIG. 4, when the input potential (input level e10) is at zero, the output frequency (fc) is fo (Hz). Output frequencies fH (Hz) and fL (Hz) are obtained at positive and negative peaks emax and -emax of the input potential, respectively. Thus, the output frequency (fc) can be deviated by $\pm \Delta f$ (Hz) from the center frequency of fo (HZ) ($\Delta f = fH - fo = fo - fL$).

A V/F converter circuit used in such a frequency modulation system is conventionally made of a linear circuit (IC), and a drift of the operating point of the circuit may happen. The drift is liable to be increased not only according to ambient conditions, such as temperature, but also in long use. Such a drift causes a frequency shift in the V/F converter output. Namely, even if the input potential of the V/F converter is at zero, a frequency shift (fd) corresponding to the magnitude of a drift appears in the converter output frequency. From this, when the input is varied from -emax to emax in this situation, the output frequency is varied from fL+fd (Hz) to fH+fd (Hz).

When such a drift appears, an output frequency, exactly corresponding to the input potential, can no longer be obtained, resulting in posing problems in data transmission. Suppose a case where data in a form of a series of signals having a predetermined frequency is transmitted with a certain drift, for example. Then, the data is transmitted with an erroneously shifted transmission frequency, so that the transmitted data is inaccurately confirmed at the receiver side. Similar problems may arise when a drift is involved in the input potential per se.

The V/F converter output has a form of a signal series with instantaneously varied frequencies. If it is intended to effect a drift compensation through data processing of the signal series, an enormous drift compensation circuit is required. Consequently, it has been desired to develop a compensation circuit, which can achieve the drift compensation without complicating the circuit configuration.

SUMMARY OF THE INVENTION

It is accordingly an object of the present invention to provide a V/F converter which can supply, through compensation for a frequency shift due to a drift involved in a V/F converter circuit or due to a drift contained in a converter input per se, a frequency conversion output being free of the drift.

To achieve the above object, the present invention is provided with a V/F converter circuit for converting an input potential into an output frequency which represents the instantaneous value of the input potential, and a difference detection circuit for generating an output representing the difference between the output frequency of the V/F converter circuit and a predetermined reference frequency. The V/F converter circuit is controlled according to the output level of the difference detection circuit so as to reduce the amount of the output frequency shift of the V/F converter circuit with respect to the reference frequency.

BRIEF DESCRIPTION OF THE DRAWINGS

FIGS. 2A to 2I show a timing chart explaining the operation of the V/F converter of FIG. 1;

FIG. 6A is a block diagram showing a modification of the embodiment of FIG. 6;

FIGS. 9A to 9H show a timing chart explaining the operation of the V/F converter of FIG. 8;

FIG. 12 is a block diagram showing a yet another embodiment of a V/F converter of the invention;

FIG. 13A is a flow chart explaining the operation of microcomputer 240 shown in FIG. 12;

FIG. 14 is a schematic representation of a modification of the embodiment of FIG. 1, in which a single linear operational amplifier is applied to analog adder 10 and D/A converter 26;

FIGS. 16A to 16H show a timing chart explaining the operation of the V/F converter of FIG. 15.

DETAILED DESCRIPTION OF THE PREFERRED EMBODIMENT

Now, preferred embodiments of the invention will be described with reference to the accompanying drawings. In the following description, the same or similar reference symbols are used to indicate the same or similar elements, thereby avoiding redundant explanations.

Figure 1:
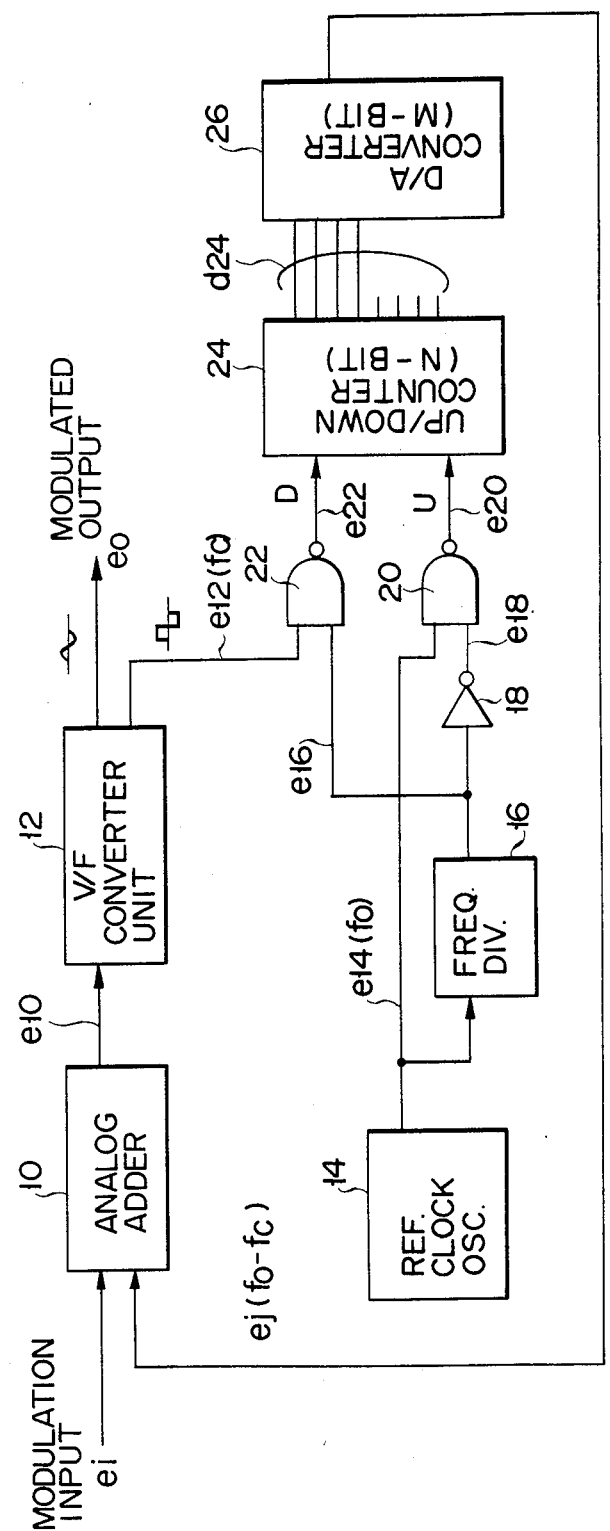
FIG. 1 is a block diagram showing an embodiment of a V/F converter according to the present invention.

FIG. 1 shows an embodiment of the present invention. Modulation input signal ei is led to analog adder 10. In adder 10, a drift compensation value (ej) to be described later is combined with ei. Output e10 from adder 10 is applied, as a V/F conversion input, to V/F converter unit 12. By unit 12, output e10 is converted into frequency information (fc). V/F converter unit 12 provides two separate outputs eo and e12, each representing the frequency information. Output eo may be either a sine wave signal or a triangular wave signal. Output e12 may be a rectangular wave pulse having the same frequency as eo.

Reference clock oscillator 14 generates clock pulse e14 having frequency fo. Pulse e14 is frequency-divided through frequency divider 16. Frequency-divided output e16 from divider 16 is applied to inverter 18 and to NAND gate 22. Gate 22 also receives output e12 from V/F converter unit 12. Gate 22 supplies logical NAND output e22 to down-count terminal D of N-bit up/down counter 24. Inverted output e18 from inverter 18 and clock pulse e14 from oscillator 14 are fed to NAND gate 20. NAND gate 20 supplies logical NAND output e20 to upcount terminal U of counter 24.

N-bit up/down counter 24 up-counts the number of clock pulses e20 at up-count terminal U when the logical level of e22 at down-count terminal D is "1". Also, counter 24 down-counts the number of clock pulses e22 at terminal D when the logical level of e20 at terminal U is "1". Several upper bits of count output d24 from counter 24 are coupled to digital/analog converter (hereinafter referred to as D/A converter) 26 with M-bit input. D/A converter 26 generates analog compensation signal ej representing the content of count d24. Signal ej is supplied to analog adder 10 so that it is added to input signal ei.

Incidentally, the number (integer) N of the output bits of counter 24 is independent of the number (integer) M of the input bits of D/A converter 26, and integer M is selected to be equal to or less than the integer N.

Output frequency fc (Hz) of V/F converter unit 12, obtained when input signal ei is at "0" level, is set at a value substantially equal to the oscillation frequency fo (Hz) of reference clock oscillator 14. On the other hand, frequency fc may be set at a frequency-multiplied or frequency-divided value (fo*) of oscillation frequency fo (fo*≠fo).

The operation of the embodiment of FIG. 1 will now be described with reference to the timing chart of FIGS. 2A to 2I. For the sake of simplicity, a specific case in which the potential of input signal ei is zero is considered. (At this time, potential of e10 is also zero.)

Figure 4:
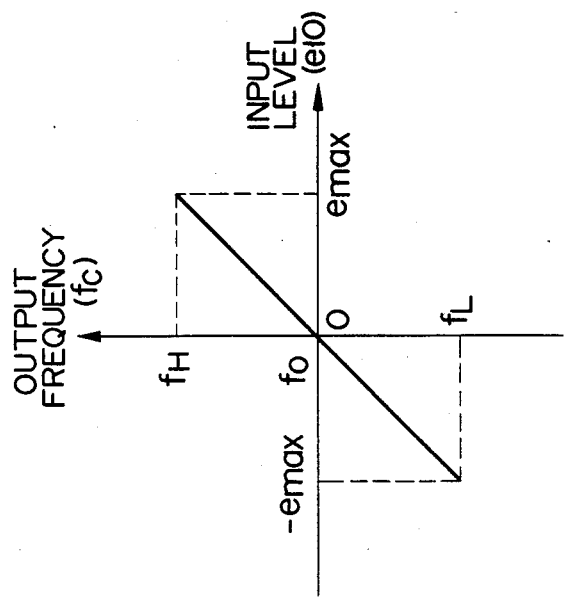
FIG. 4 is a graph showing an input/output characteristic of V/F converter unit 12 in FIG. 1.

When no drift appears in V/F converter unit 12 and if the level of input e10 for unit 12 is zero, then, as will be seen from the V/F conversion characteristic of FIG. 4, V/F converter unit 12 generates signals eo and e12 with fixed frequency fc=fo (Hz) (FIG. 2A). Output e14 (FIG. 2B) of reference clock oscillator 14 is frequency-divided by frequency divider 16. NAND gate 22 receives the fixed level (logic "1" or "0") of output e16 from divider 16 and output e12 from unit 12, and supplies logical NAND output e22 (FIG. 2E) to down-count terminal D of counter 24. Meanwhile, inverter 18 inverts the phase of frequency-divided output e16. NAND gate 20 receives the fixed level (logic "0" or "1") of output e18 (FIG. 2D) from inverter 18 and output e14 from reference clock oscillator 14, and supplies logical NAND output e20 (FIG. 2F) to up-count terminal U of counter 24.

Counter 24 down-counts every time a clock pulse of e22 is applied to down-count terminal D while e20 is "1", as noted before. Namely, a period from time t0 to t1 in FIGS. 2G to 2I is a down-count period. During a period from t1 to t2, on the other hand, output e20 of NAND gate 20 is applied to up-count terminal U of counter 24 while e22 is "1". Namely, this period is an up-count period. Thus, counter output d24 at instant t2 indicates the frequency difference (fo−fc), obtained at t2, between V/F converter output e12 and reference clock output e14.

The above operation is repeated until time tn, whereby a count indicating the frequency difference (fo−fc) between the two clocks (e20, e22), noted above, is obtained as output d24 of counter 24.

FIG. 2G shows output d24 of counter 24 in a case where the frequency of V/F converter output e12 matches the frequency of reference clock output e14 (fc=fo). FIG. 2H shows a case where the frequency of e12 is higher than that of e14 (fc>fo). FIG. 2I shows a case where the frequency of e12 is lower than that of e14 (fc<fo).

D/A converter 26, which is located at the subsequent stage of counter 24, receives only several upper bits (M bits) of the output (N bits) of counter 24, and it converts the M-bit digital count value (d24) into a corresponding analog value (ej). The resultant analog output ej is fed to analog adder 10.

Figure 3:
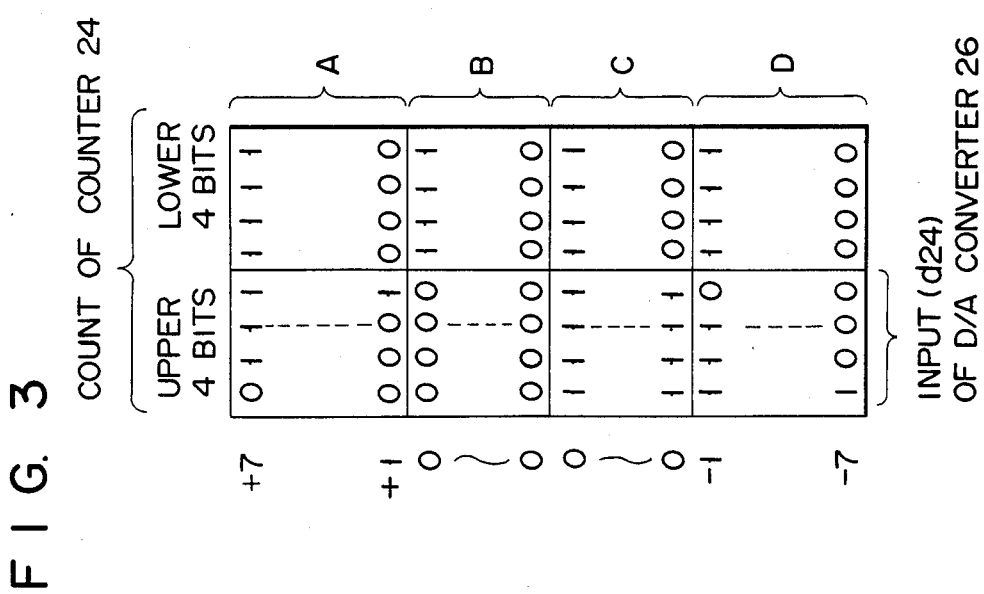
FIG. 3 illustrates an example of the count of counter 24 in FIG. 1.

The table of FIG. 3 shows the count of counter 24 when counter 24 is an 8-bit counter and D/A converter 26 is a 4-bit D/A converter. Since D/A converter 26 receives the upper 4 bits of 8-bit counter 24, the value of converter output ej retains zero for a slight frequency difference (fo−fc) which is contained in the range of the lower 4 bits. Thus, in a case where the frequency difference (fo−fc) is slight, since the application of a compensation signal component (ej) to V/F converter unit 12 is stopped, flicker (or jitter) of output eo due to the change of the frequency difference can be avoided.

Referring to FIG. 3, when count d24 of counter 24 is at region B or C, the potential (or signal level) of analog output ej from D/A converter 26 retains zero. On the other hand, when count d24 enters region A or D, the potential of output ej changes in correspondence with each count d24 having a value form +1 to +7 or from −1 to −7. Such output ej is fed to analog adder 10.

FIG. 2I exemplifies a case in which frequency fc of V/F converter output e12 is lower than frequency fc of reference clock e14. This means, as will be seen from the V/F conversion characteristic of FIG. 4, that a negative drift (negative DC level shift) appears in the preceding circuit stages and/or in V/F converter unit 12. When counter 24 is preset such that its counting starts from zero and if fc<fo is assumed in the case of FIG. 2I, the count of counter 24 deviates toward the positive side (+1 to +7).

Positive analog output ej thus obtained from D/A converter 26 is added in adder 10 to input signal ei. Then, even if input signal ei contains a negative drift as noted above, since this negative drift is compensated (or cancelled) by positive output ej, the output of adder 10, or input e10 of V/F converter unit 12, can be free of the influence of the drift. Further, even if a DC level shift of e10 is caused by analog adder 10, or even if V/F converter unit 12 per se involves a drift, outputs eo and e12 from unit 12 can also be free of the drift because of the compensation function of ej. Thus, the V/F converter of the invention is free of the frequency shift due to any drift.

In the above explanation regarding the drift, the potential or level (or magnitude) of input signal ei is assumed to be zero. However, similar drift compensation can be achieved even where input ei is an AC signal with a certain amplitude. This will now be described in a detail below.

When input signal ei is a sine wave, for instance, output e12 of V/F converter unit 12 has a coarse-and-dense waveform with a frequency varying in accordance with the level of ei. However, the number of pulses of e12 contained in one cycle of ei becomes a fixed value irrespective of whether the amplitude of ei is zero or not. For instance, assume a case where the output frequency of V/F converter unit 12 is set at 1,900 Hz (fc=fo) when the amplitude of input ei is zero, and assume that the frequency of ei is 50 Hz. (In this case, one cycle period of ei is 20 msec.) Then, 1.900×0.02=38 pulses are contained in 20 msec period.

When input ei is not zero but is a 50 Hz sine wave, output e12 of V/F converter unit 12 has a coarse-and-dense waveform with an unfixed frequency (fc=fo±50 Hz) centered on 1,900 Hz (fo). Also in this case, output e12 of V/F converter unit 12 contains 38 pulses in one cycle period (20 msec) of the 50 Hz sine wave. Thus, the number of pulses contained in one cycle of e12 is fixed (38 pulses) whether the amplitude ei is zero or not. This is because the integral of the waveform of sine wave input ei over one cycle period is zero. If input signal ei involves a DC drift but this DC drift is not compensated by ej, the number of pulses contained in one cycle of output e12 varies from 38 pulses and has a value corresponding to the degree or the magnitude of the drift.

It is to be noted the fact that the number of pulses contained in one cycle of sine wave output e12 is independent of the amplitude (magnitude) of e12 may be applicable to a case where the number of pulses is considered for more than one cycle of e12. Further, when a long period of time is considered in the order of seconds or more without any particular attention to the cycle of e12, there is no problem in assuming that the number of pulses contained in such a long time period is constant on an average.

Incidentally, even if no drift is involved in the embodiment of FIG. 1, frequency fc varies in accordance with the level or amplitude of signal ei. However, when such a varied frequency (fc) is averaged for a period more than one cycle of ei, the averaged frequency becomes equal to the frequency (fc) that obtained at ei=0. Thus, the number of oscillations of the averaged frequency (fc) for a fixed period of time is equal to that of frequency fc for the same fixed period of time.

As has been described above, in the embodiment of FIG. 1, count d24 corresponding to the difference between output frequency fc of V/F converter unit 12 and reference clock frequency fo is detected to provide compensation value ej in the form of an analog quantity, and compensation value ej is used to cancel a DC drift involved in the circuit of V/F converter unit 12. Therefore, it is possible to make V/F converter outputs eo and e12 free of a frequency shift due to a drift. The invention thus can solve a prior art problem of inaccurate data confirmation of data transmission which is occurred in the receiver side due to a drift involved in the transmitter side utilizing frequency modulation.

Further, when a case in which signals with a given constant frequency are to be transmitted and received to detect the defect of a transmission system based on an extraordinary change in the signal frequency is considered, according to a prior art device, a drift involved in the transmitter side causes an erroneous confirmation, at the receiver side, that the transmission system, inclusive of a local carrier station, becomes defective.

Such a problem can also be solved according to the present invention. More specifically, when the invention is applied to a case in which signals with given fixed frequencies are transmitted and received, even if a drift appears at the transmitter side, such a drift is not reproduced at a demodulator section in the receiver side. Consequently, it is possible to avoid an erroneous confirmation of the defectiveness of the transmission system.

Figure 6:
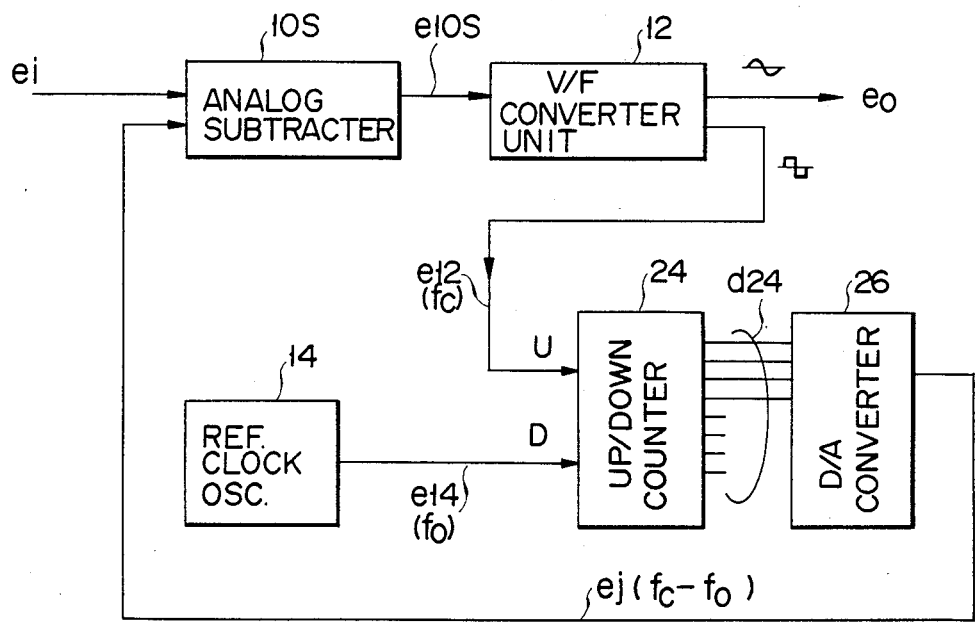
FIG. 6 is a block diagram showing another embodiment of a V/F converter according to the present invention.
Figures 7A, 7B, 7C, 7D:
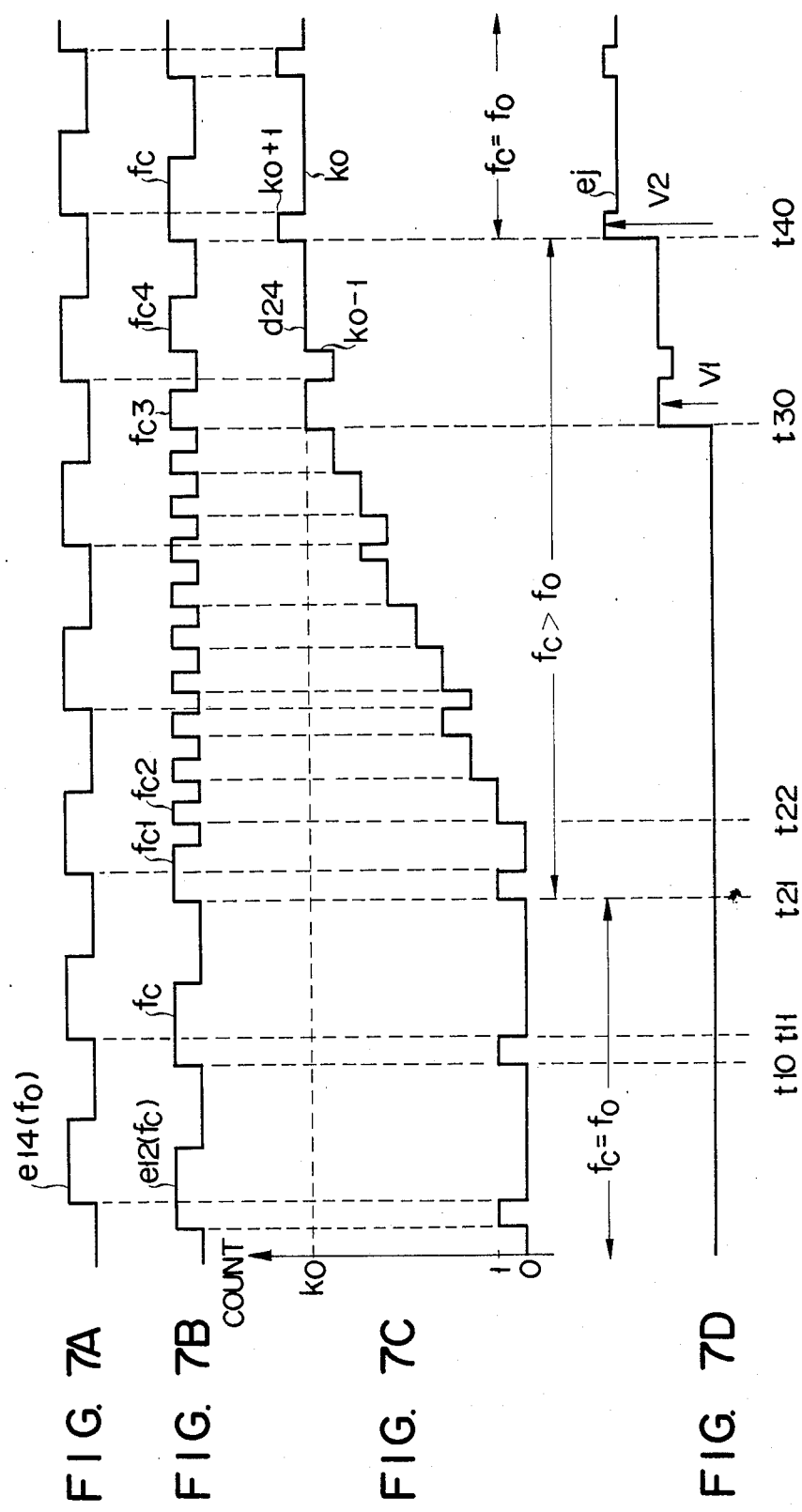
FIGS. 7A to 7D show a timing chart explaining the operation of the V/F converter of FIG. 6.

FIG. 6 shows another embodiment of the present invention. This embodiment may be considered as a best mode contemplated by the inventor. In the preceding embodiment of FIG. 1, counter 24 is switched to perform up- and down-counting operations for every fixed period (i.e, one half cycle of e16 or e18), with a signal of logic level "1" fed to up-count terminal U and a signal of logic level "1" fed to down-count terminal D. In the embodiment of FIG. 6, counter 24 operates in a manner different from the operation of counter 24 in FIG. 1. More specifically, the up- and down-counting operations are freely activated alternatively, with output e12 of V/F converter unit 12 fed to up-count terminal U and with output e14 of reference clock oscillator 14 fed to down-count terminal D.

FIGS. 7A to 7D are a timing chart explaining the operation of the circuit shown in FIG. 6.

Assume that no frequency shift due to any drift exists and frequency fc of output e12 from V/F converter unit 12 matches frequency fo of reference clock e14 (i.e., fc=fo). Then, immediately after counter 24 up-counts one clock of e12 (t10 in FIGS. 7B and 7C), it performs down-counting of e14 (t11 in FIGS. 7A and 7C). Thus, count output d24 of counter 24 is either "0" or "1", and compensation value ej (fc−fo) can be considered substantially zero.

If frequency fc of e12 becomes higher than frequency fo of e14 (fc>fo subsequent to t21 in FIGS. 7A and 7B), counter 24 up-counts more pulses than down-counted pulses. Count d24 thus gradually increases (t21 to t30 in FIG. 7C). When the lower 4 bits of d24 from counter 24 are filled and a carry-out is produced for the fifth bit (corresponding to the least significant digit LSD of D/A converter 26), potential V1 is provided as ej. This potential V1 corresponds in magnitude to d24 (or to data K0) (t30 in FIGS. 7C and 7D). At this instant (t30), the relation fc>fo still holds, with the number of up-counted pulses exceeding the number of down-counted pulses. Therefore, count output d24 is further increased (corresponding to Ko+1), and the potential of ej is increased to V2 with the increase of d24 (t40 in FIGS. 7C and 7D). Correction of fc is thus done according to ej which represents the difference between fc and fo. When fc becomes equal to fo, count d24 of counter is stabilized between Ko and Ko+1.

In a case where fc<fo holds, count d24 of counter 24 is increased toward the negative side with the passage of time, and the potential of ej is reduced in the negative direction (while the absolute value of ej is increased). As to the rest, the operation is the same as in the case of FIGS. 7A to 7D, and fc is compensated or corrected to fc=fo. It is to be noted that elements 10S, 12, 24 and 26 in the embodiment of FIG. 6 form a negative feedback loop, through which frequency fc of output eo or e12 is made to follow reference frequency fo.

In the embodiment of FIG. 1, the form of change of output d24 from counter 24 has positive and negative slopes alternatively, as shown in FIGS. 2G to 2I. In contrast, according to the embodiment of FIG. 6, the form of change of output d24 from counter 24 differs from that of FIG. 1, but it always indicates the difference between the two frequencies respectively applied to the up- and down-count terminals of counter 24. Thus, the FIG. 6 embodiment achieves a drift compensation, without supplying to D/A converter 26 useless information from counter 24, during the period of counting. This is an advantageous feature of the embodiment of FIG. 6 over the FIG. 1 embodiment.

Figure 5A:
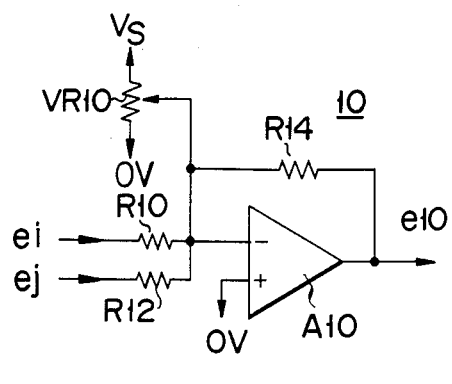
FIG. 5A is a circuit diagram showing a specific circuit configuration of analog adder 10 in FIG. 1.

In the embodiment of FIG. 1, the up-counting is effected by e20 corresponding to e14 (fo), while the down-dounting is effected by e22 corresponding to e12 (fc). Thus, ej has a DC level corresponding to fo−fc. For this reason, ej is added to ei. An example of analog adder 10 which is used in this case is shown in FIG. 5A. In FIG. 5A, the symbol A10 denotes an operational amplifier; R10–R14, resisters; VR10, an off-set balancer; and Vs, a bias potential.

Figure 5B:
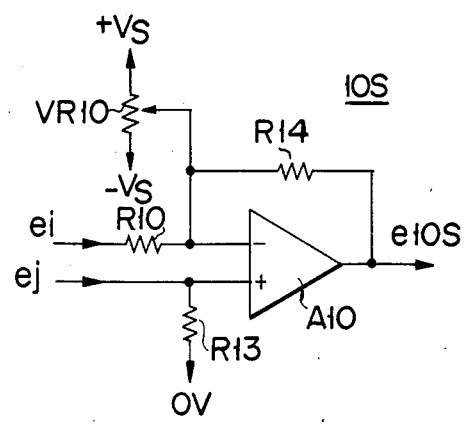
FIG. 5B is a circuit diagram showing a specific circuit configuration of analog subtracter 10S in FIG. 6.

In the embodiment of FIG. 6, on the other hand, the up-counting is effected by e12 (fc), while the down-counting is effected by e14 (fo), so that the DC level of ej corresponds to fc−fo. That is, ej in the case of FIG. 6 has the opposite polarity to ej in the case of FIG. 1. From this, in the embodiment of FIG. 6, drift compensation value ej is subtracted from input ei by analog subtracter 10S. It should be understood that analog adder 10 of FIG. 1 is to be replaced with analog subtracter 10S, if e22 and e20 are applied to up- and down-count terminals U and D of counter 24, respectively. An example of such analog subtracter 10S is shown in FIG. 5B.

Incidentally, when subtracter 10S of FIG. 6 is to be replaced with adder 10, a circuit configuration as shown in FIG. 6A may be employed.

Figure 1A:
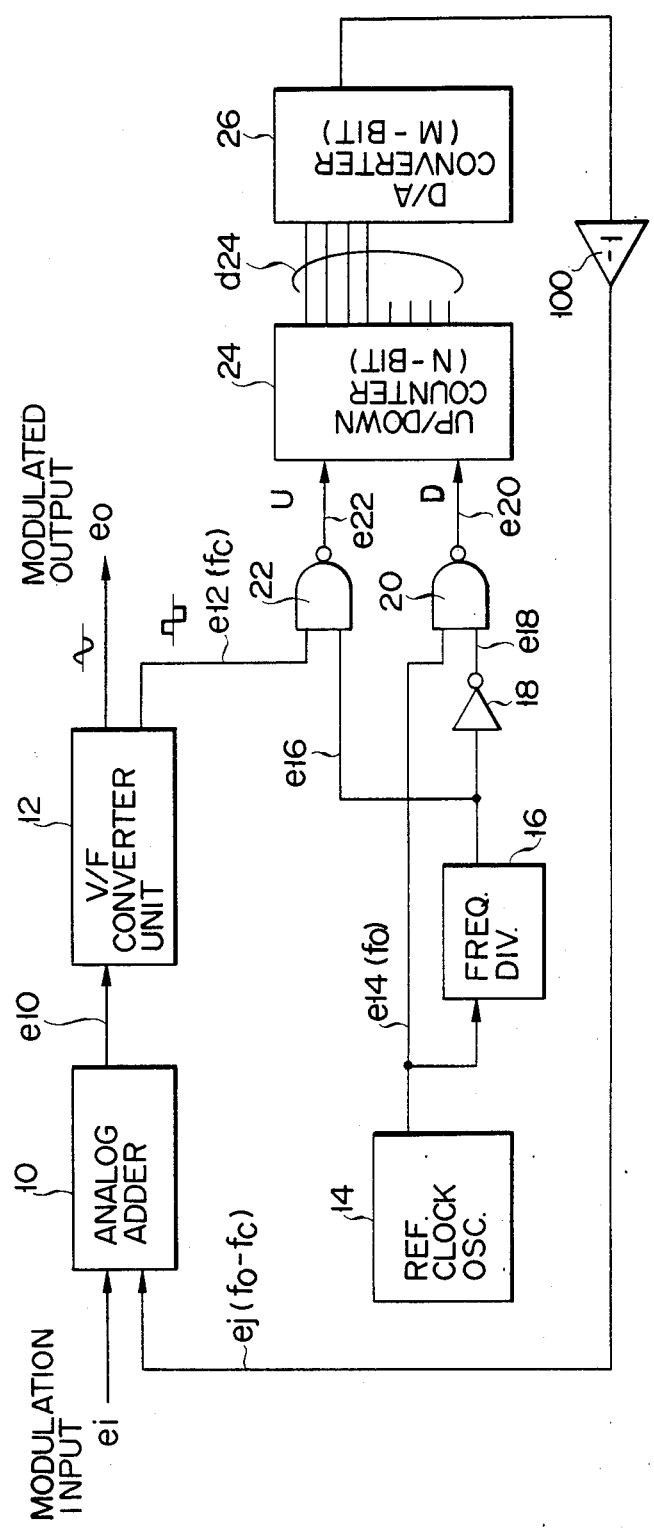
FIG. 1A is a block diagram showing a modification of the embodiment of FIG. 1.

FIG. 1A shows a modification of the embodiment of FIG. 1. In this embodiment, outputs e22 and e20 are fed to up- and down-count terminals U and D of counter 24, respectively. Output e26 of D/A converter 26 is phase-inverted through phase inverting amplifier (inverter) 100 before it is fed to analog adder 10.

Figure 8:
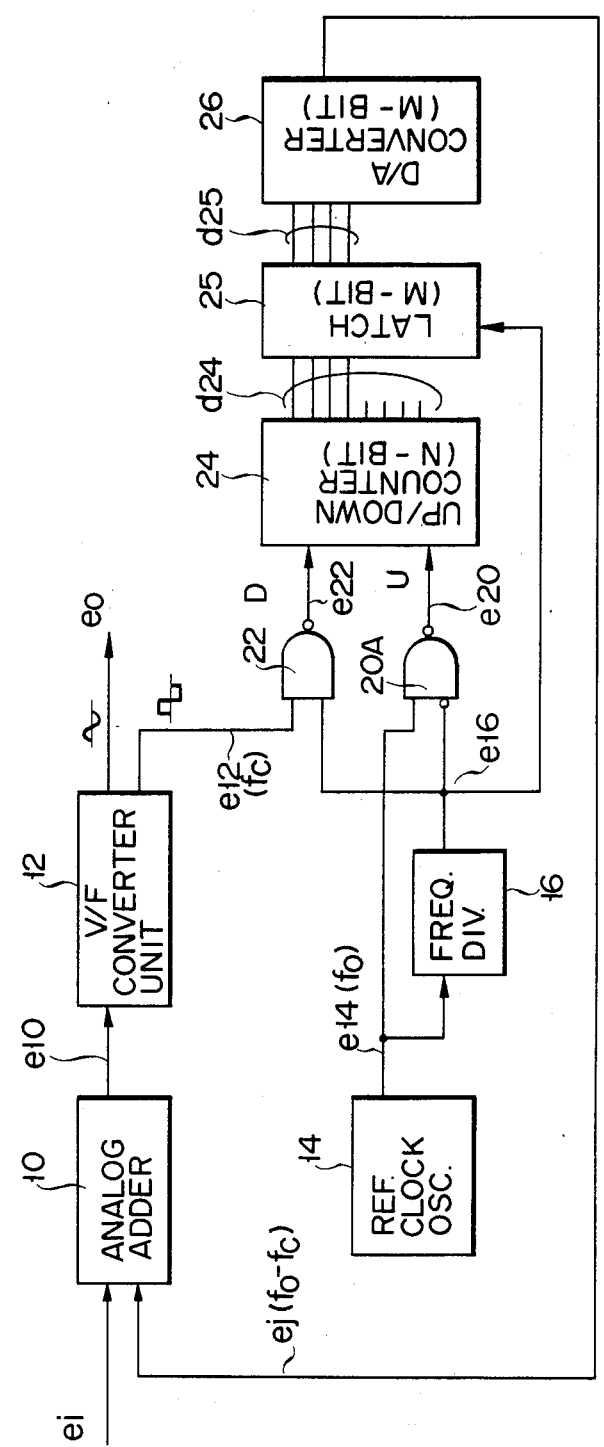
FIG. 8 is a block diagram showing a further embodiment of a V/F converter according to this invention.

FIG. 8 shows a further embodiment of the invention. In this embodiment, latch 25 is provided at the output side of counter 24 so that output d24 of counter 24 is latched for every cycle of frequency divider output e16 (FIG. 2C). Latched output d25 is applied to D/A converter 26.

FIGS. 9A to 9H form a timing chart explaining the operation of the embodiment of FIG. 8. Counter output d24 is latched at the rising edge of output e16 (FIG. 9G) from frequency divider 16, which appears at the end (t100, t101, t102 and t103) of the up-counting of counter 24. Output d25 of latch 25 is thus fixed ($d24_0, d24_1, d24_2$ in FIG. 9H) during each period in which no counter output is latched.

With this arrangement, D/A converter 26 can be free of output d24 from counter 24 which quickly changes during counting. Instead, latched output d25, which is fixed during counting, is fed to D/A converter 26. It is thus possible to obtain compensation output ej with smooth level change. This smoothly-changed ej provides an effect of reducing slight variations in the frequency of eo (jitter), and it is an advantageous feature of the FIG. 8 embodiment.

While the embodiment of FIG. 8 uses for counter 24 an up-down counter capable of both up- and down-counting operations, it is also possible to use a presettable counter for only up- or down-counting operation.

Figure 10:
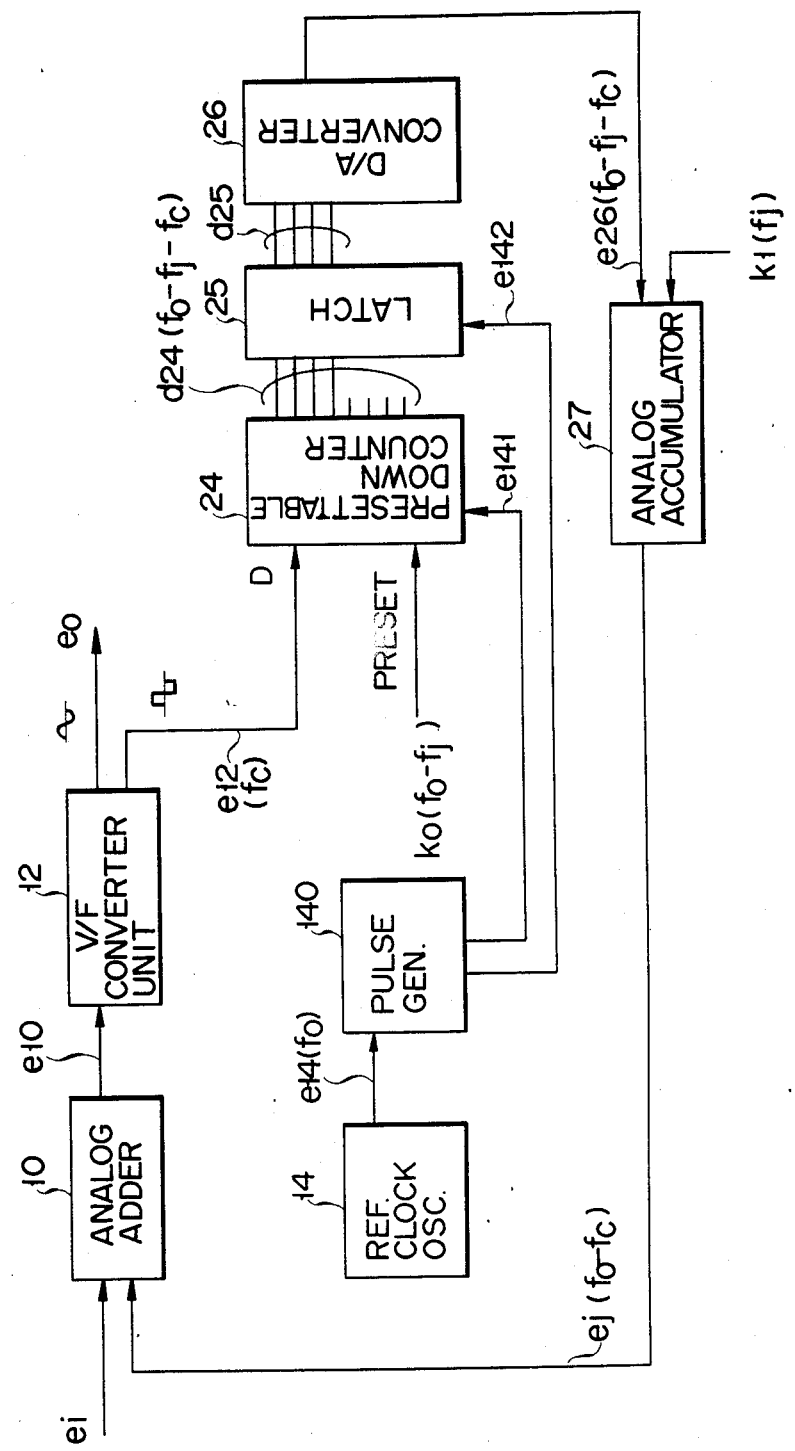
FIG. 10 is a block diagram showing a still further embodiment of a V/F converter of the invention.

FIG. 10 shows an embodiment which uses such a presettable counter. In the embodiment of FIG. 10, the upper limit of the degree of the drift compensation is prefixed. It is assumed that the frequency corresponding to this limit is denoted by fj. Preset value Ko, which represents a count corresponding to the difference (fo−fj) between reference frequency fo and drift upper limit frequency fj, is supplied to a preset value input terminal of counter 24. Output e14 of reference clock oscillator 14 is frequency divided in pulse generator 140 to obtain first latch signal e141 whose cyclic period is fixed. This signal e141 is applied to counter 24. Preset value Ko is loaded as initial value of counting in counter 24. Presettable counter 24 is a down-counter which down-counts, with loaded initial value Ko, the pulses of output e12 from V/F converter unit 12.

After passing a predetermined period of time (corresponding to one cycle of e16), output d24 from counter 24 is latched at latch 25 under the control of second latch signal e142 delivered from pulse generator 140. Latch 25 then provides output d25 which contains, as parameters, information of frequency fc of V/F converter output e12, upper limit frequency fj and reference frequency fo. Output 25 is converted by D/A converter 26 into analog value e26 (fo−fj−fc) which is applied to analog accumulator 27. Also applied to analog accummulator 27 is bias value K1 which corresponds to fj. Then, output ej of analog accumulator 27 has a potential corresponding to the difference (fo−fc) between reference frequency fo and output frequency fc of V/F converter unit 12. This output ej is supplied as a drift compensation value to analog adder 10, so that the DC level shift of input signal ei is compensated, thereby achieving the relation fc=fo for the output (eo, e12) of V/F converter unit 12.

FIGS. 11A to 11G show a timing chart explaining the operation of the embodiment of FIG. 10. When data Ko corresponding to fo−fj is preset in counter 24 under control of first latch signal e141 (t200 in FIG. 11C), counter 24 starts to down-count the pulses of output e12 (fc) from V/F converter unit 12, with Ko as an initial value. During a period in which fc=fo holds, second latch signal e142 is generated when count output d24 of counter 24 becomes a value corresponding to −fj (t202 in FIGS. 11D and 11E). Since latched output d25 in this case corresponds to −fj, output e26 of D/A converter has a potential corresponding to −fj (t202 in FIG. 11F). Output e26 (−fj) thus obtained is combined with K1=+fj in analog accumulator 27, and drift compensation output ej becomes zero (t202 in FIG. 11G).

Figure 11:
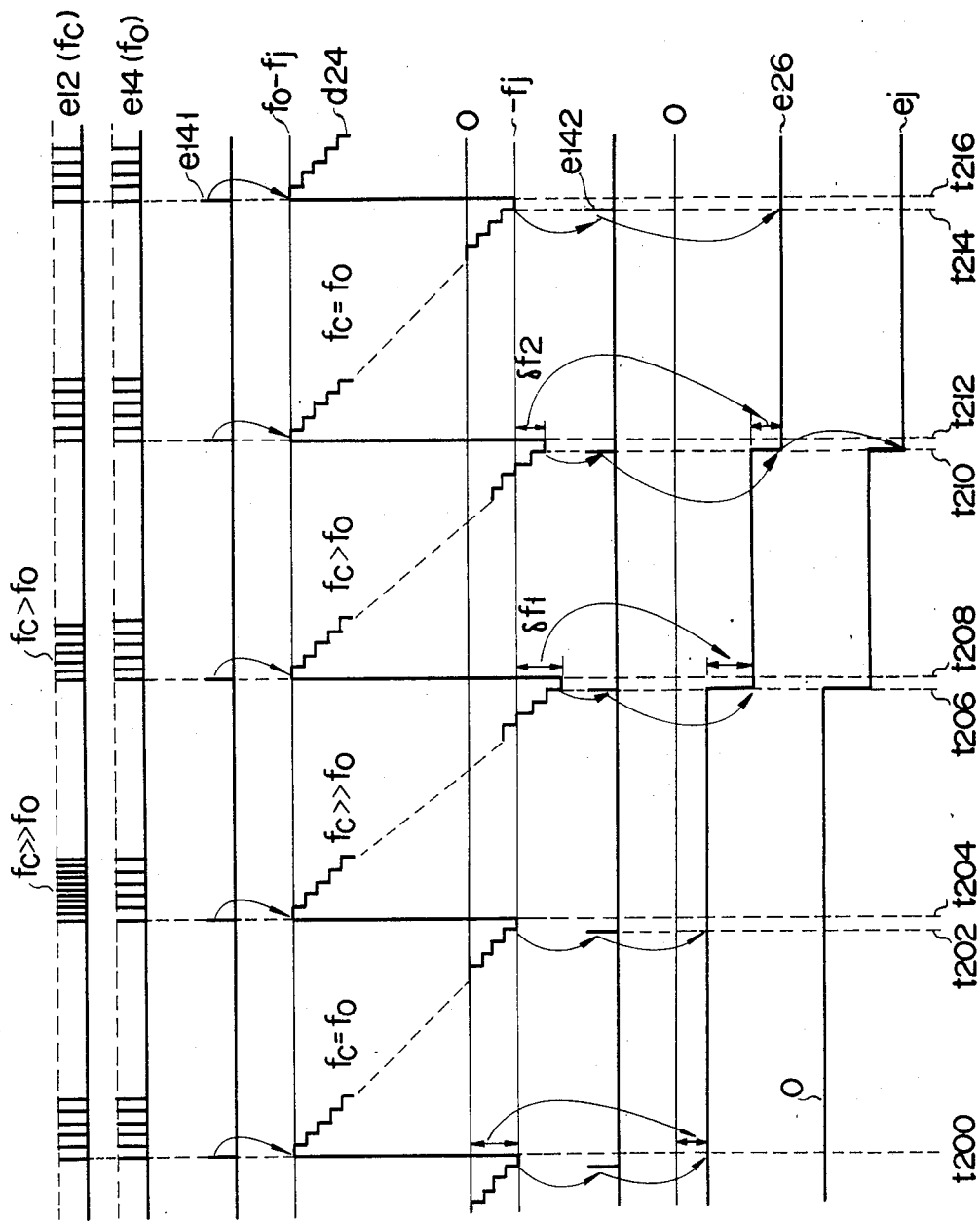
FIGS. 11A to 11G show a timing chart explaining the operation of the V/F converter of FIG. 10.

Data Ko is preset again in counter 24 by subsequent first latch signal e141 (t204 in FIG. 11C). If fc>>fo holds at this time, count d24 of counter 24 is reduced to a value corresponding to −fj−δf1 until subsequent second latch signal e142 is generated (t206 in FIG. 11E). (δf1 represents |fc−fo| when fc>>fo.) For this reason, the potential of D/A converter output e26 is lower, by an amount corresponding to δf1, than the value obtained when fc=fo holds (t206 in FIG. 11F). Compensation output ej is, accordingly, reduced by an amount corresponding to δf1 so as to lower fc (i.e., cause fc to approach fo).

Data Ko is present once again in counter 24 by subsequent first latch signal e141 (t208 in FIG. 11C). If fc>fo holds at this time, count d24 of counter 24 is lowered to a value corresponding to −fj−δf2 until subsequent second latch signal e142 is generated (t210 in FIG. 11E). (δf2 corresponds to |fc−fo| when fc>fo.) In this case, a value corresponding to δf2 is added in accumulator 27 to e26 at t206, and the potential of e26 is further reduced (t210 in FIG. 11F) from the potential obtained at t206. Consequently, the DC level of compensation output ej is further reduced (t210 in FIG. 11G), causing fc to further approach fo.

When relation fc=fo is obtained at t210, the drift in V/F converter unit 12 is compensated by the level of ej at this instant, and V/F converter output eo is fixed at frequency fo (subsequent to t210 in FIGS. 11A to 11G).

Incidentally, in the respective embodiments, counter output d24 may be in the form of 1's complement, 2's complement, an off-set binary code, etc. Data in FIG. 3 are in the form of 1's complement. If the offset binary code is used, the initial value of the counter is not "0" but is set at near the one half of the full scale count value of the counter. In this case, the code format of D/A converter 26 may be selected such that compensation value ej corresponding to the central value of the full scale count is "0".

Further, while the above embodiments have been described by assuiming 8 as N of N-bit counter 24 and 4 as M of M-bit D/A converter 26, N and M are not limited to these numbers but they may have any specific numbers.

In the embodiments of FIGS. 1, 6, 8 and 10, the respective circuit elements can be constructed by discrete ICs.

In contrast, FIG. 12 shows another type of embodiment, in which microcomputer 240 is used for performing similar drift compensation processing with software. More specifically, output e12 of V/F converter unit 12 is fed to port P1 of microcomputer 240 so that pulses of e12 (fc) are counted for a predetermined period of time. Also, reference frequency output e14 (fo) from clock oscillator 14 is fed to port P2 so that pulses of e12 are counted for the predetermined period of time. Then, the counts (fo, fc) for e12 and e14 are compared, and their difference data d240 (fo−fc) is applied to D/A converter 26. These processes are implemented by software.

FIG. 13A shows a flow chart of an example of the routing programmed in microcomputer 240 of FIG. 12. This routine is used to perform signal processing which is similar to that performed in the embodiment of FIG. 1. To be concrete, frequency fc of V/F converter output e12 is counted by counter (not shown) contained in microcomputer 240 (ST10). Following to this, reference frequency fo is similarly counted (ST12). (The order of ST10 and ST12 may be exchanged.) Then, the counts of fo and fc are compared (ST14), and data d240 representing the difference (fo−fc) is produced (ST16).

If the absolute value of data d240 is greater than predetermined threshold value fx which is provided for performing the decision as to whether drift compensation is to be started (YES in ST18), fc is compensated, by changing the DC level of input ei, with compensation value ej corresponding to d240 (ST20). Steps ST10 to ST20 are repeated until the absolute value of d240 becomes smaller than fx. When the absolute value of d240 becomes smaller than fx (NO in ST18), microcomputer 240 decides that fc substantially matches fo. Then, microcomputer 240 ends the processing of FIG. 13A. At this time, data d240 (i.e., the potential of ej) is locked at a certain fixed value corresponding the count difference (fo−fc). The processing of FIG. 13A is repeated periodically.

Figure 13B:
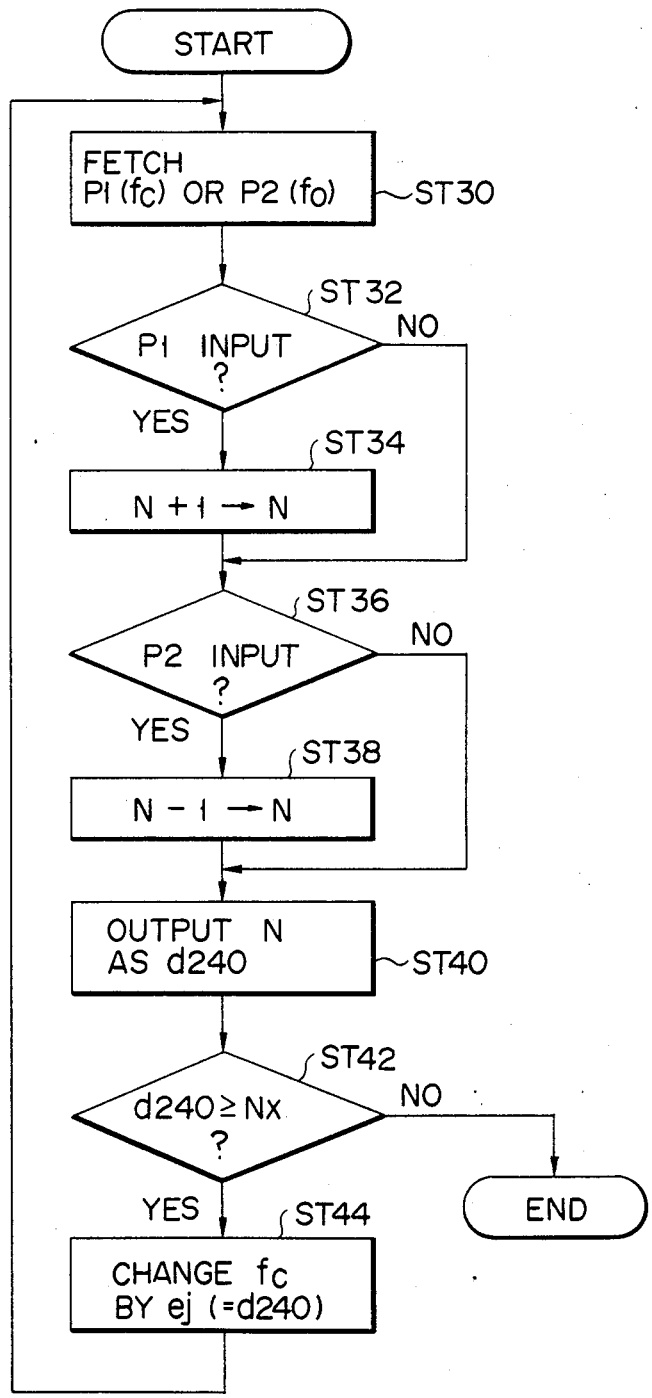
FIG. 13B is a flow chart explaining another operation of microcomputer 240 shown in FIG. 12.

FIG. 13B shows a flow chart of another example of the routine programmed in microcomputer 240 of FIG. 12. This routine is used to perform signal processing which is similar to that performed in the embodiment of FIG. 6. To be concrete, first, either V/F converter output e12 (fc) at input port P1 or reference frequency signal e14 (fo) at input port P1 is fetched into microcomputer 240 (ST30). If the fetched signal is e12 (YES in ST32), the count (N) of a counter (not shown) in microcomputer 240 is incremented by one (ST34). If the fetched signal is not e12 (NO in ST32) but e14 (YES in ST36), the count (N) of the counter is decremented by one (ST38). If neither signal e12 nor e14 is fetched (NO in ST32 and ST36), the count value of the counter is not changed.

Count N is provided as data d240 which represents the difference between fc (e12) and fo (e14) (ST40). If the magnitude (or absolute value) of data d240 is greater than given threshold value Nx representing the reference level for the start of the drift compensation (YES in ST42), the DC level of input ei is renewed by ej corresponding to d240 (ST44), so that fc is brought closer to fo. Steps ST30 to ST44 are repeated until the manitude of d240 becomes smaller than Nx.

When the magnitude of d240 becomes smaller than Nx (NO in ST42), microcomputer 240 determines that fc substantially matches fo and ends the processing of the flow of FIG. 13B. At this time, potential ej is locked at a constant value corresponding to the prevailing contents of d240. The processing of the flow of FIG. 13B is repeated periodically.

In the above embodiments, output ej of D/A converter 26 is combined with input ei for the drift compensation. However, the drift compensation may be performed by changing the operating bias point of V/F converter unit 12 with ej. More specifically, the operating bias point of unit 12, which bias always acts on the operation of unit 12, may be changed in accordance with the degree of a drift being generated.

FIG. 14 shows an embodiment, in which the drift compensation is effected by varying the operating bias point. More specifically, the DC bias applied to operational amplifier A10 is varied, by selective shortcircuiting of fixed resistors R101 to R105, by switch elements S1 to S4 (e.g., MOS FETs) in response to the content of count d24 form counter 24.

In the embodiment of FIG. 14, resistors R100 to R105 and switches S1 to S4 have a D/A conversion function and, accordingly, it is possible to omit D/A converter 26 used in other embodiments. Incidentally, output eo of V/F converter unit 12 may be a triangular wave, a sawtooth wave, a sine wave, a rectangular pulse wave or any other wave, that is, the waveform is limited by no means.

Further, a configuration in which output ej of D/A converter 26 is monitored by a comparator and, if the level of ej exceeds a given comparison level, alarming is generated, may be adapted to a configuration in which the DC level of input ei is compensated by feeding output ej of D/A converter 26 to analog adder 10.

Or, a configuration in which counter output d24 is checked through a comparator and alarming is generated when the value of d24 reaches a given comparison level, may be further employed.

Figure 15:
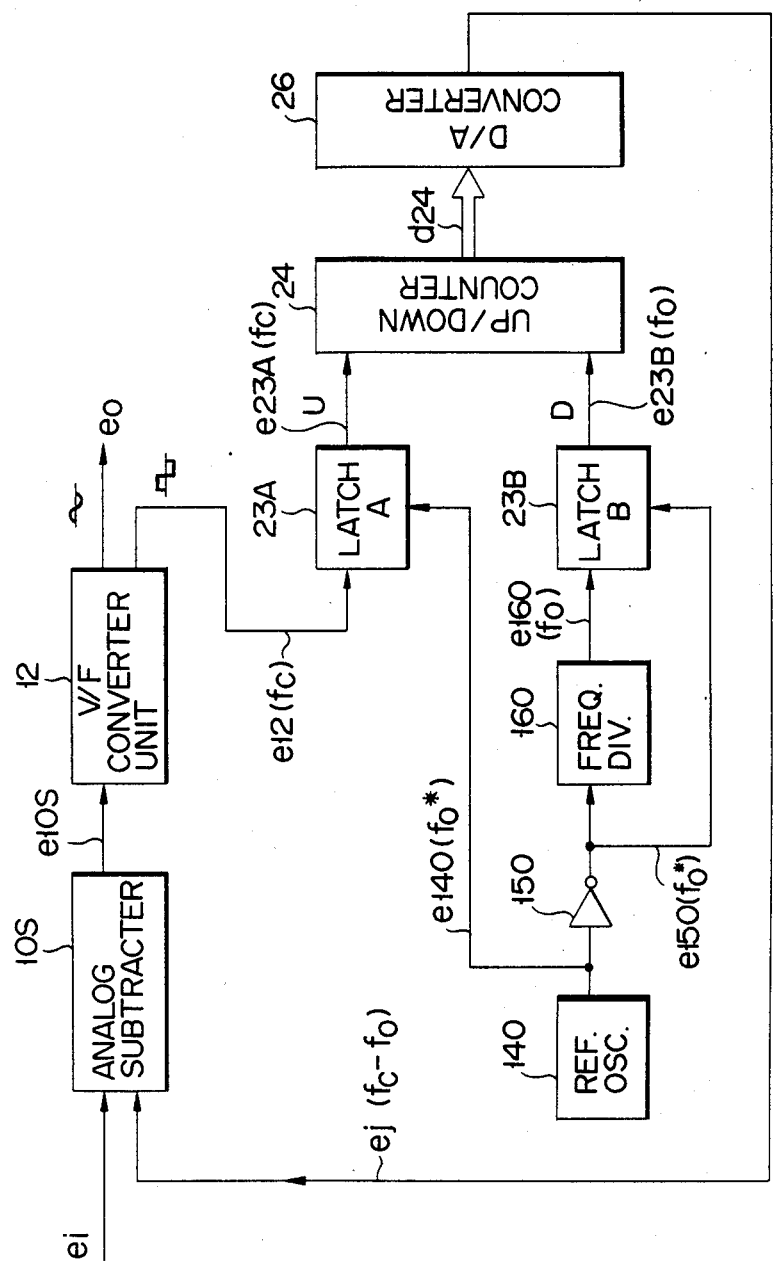
FIG. 15 is a block diagram showing a yet further embodiment of the V/F converter according to the inventon.

FIG. 15 shows a modification of the embodiment of FIG. 14. This embodiment is also preferable to reduce to practice, as in the case of the FIG. 6 embodiment. Referring to FIG. 15, latches 23A and 23B are connected to up- and down-count terminals U and D of counter 24, respectively. Latch 23A latches the signal level of V/F converter output e12 (fc), while latch 23B latches the signal level of reference frequency signal e160 (fo). Latch pulse signals e140 and e150 for respective latches 23A and 23B have the same frequency (fo*) which is far higher than fc or fo in FIG. 6, but signals e140 and e150 are in an opposite phase relation to each other. For this reason, the latch timing of latch 23A is deviated from the latch timing of latch 23B by one half the cycle of pulse signal e140. This latch timing deviation has an effect of preventing count pulses e23A and e23B from being simultaneously fed to terminals U and D of counter 24. In other words, in the embodiment of FIG. 15, counter 24 will never perform erroneous counting operation due to simultaneous appearance of count pulses e23A and e23B.

FIGS. 16A to 16H show a timing chart explaining the operation of the circuit shown in FIG. 15. When there is no frequency deviation or frequency shift due to a drift and output e12 (fc) of V/F converter unit 12 has the same frequency (fc=fo) as reference clock e160 (fo), immediately after counter 24 has up-counted one clock due to e23A (fc) latched under control of e140 (FIG. 16B), it turns to perform down-counting due to e23A (fc) latched under control of e150 (FIG. 16A). Thus, count output d24 of counter 24 is either "0" or "1", so that the level of ej (fc−fo) is substantially zero.

When fc>fo holds (t300 to t304 in FIGS. 16C and 16D), counter 24 up-counts more pulses than down-counted pulses, so that count d24 is gradually increased. (t300 to t302 in FIG. 16G). When the lower 4 bits of output d24 of counter 24 is filled, for instance, a carry-out for the fifth bit is generated and voltage V1 is provided as ej in response to the value of d24 (t302 in FIG. 16H). Since there still holds relation fc>fo at this instant (t302), that is, since the number of up-counted pulses surpasses the number of down-counted pulses, count d24 is further increased to increase the potential of ej to V2 (t304 in FIGS. 16G and 16H). As a result, fc is corrected by ej corresponding to the difference between fc and fo, and count d24 is stabilized at a value corresponding to fc=fo.

As has been described in the foregoing, according to the invention, a frequency drift generated in a circuit, inclusive of the V/F converter unit, can be compensated. Thus, it is possible to substantially eliminate any drift involved in the output from the V/F converter. Further, while the count of counter 24 corresponding to a drift is fed as an analog compensation value through D/A converter 26, since only upper several bits of counter 24 are fed to D/A converter 26, only a certain drift, which will bring about frequency deviations in excess of a predetermined extent, is compensated slowly (in the order of seconds, minutes or more). In other words, a time constant of amplitude change of the compensation value ej is far larger than that of the input signal ei. Thus, the V/F converter output (eo) can be compensated without generation of jitter which may otherwise accompany compensation for a slight drift.

While the invention has been described in connection with what is presently considered to be the most practical and preferred embodiment, it is understood that the invention is not to be limited to the disclosed embodiment but, on the contrary, is intended to cover various modifications and equivalent arrangements included within the spirit and scope of the appended claims which scope is to be accorded the broadest interpretation so as to encompass all such modifications and equivalent structures.

What is claimed is:

1. A voltage/frequency converter comprising:
voltage/frequency converter means for generating a voltage/frequency conversion output having a frequency corresponding to a voltage/frequency conversion input;
compensator means for providing a compensation signal corresponding to the difference between a predetermined reference frequency and the frequency of said voltage/frequency conversion output; and
combination means for combining said compensation signal with an a.c. converter input signal to generate said voltage/frequency conversion input, said converter input signal having an average level equal to zero in the absence of drift,
wherein said voltage/frequency converter means responds to the component of said compensation signal contained in said voltage/frequency conversion input, so that both a frequency drift of said voltage/frequency conversion output and an average level drift of the input signal are compensated for by the compensation signal so that the voltage/frequency conversion output follows said predetermined reference frequency.

2. A voltage/frequency converter according to claim 1, wherein said compensator means includes:
a counter circuit for providing an N-bit count which represents the difference between the number of oscillations of said voltage/frequency conversion output, obtained within a first given period of time, and the number of oscillations of a reference signal, obtained within a second given period of time and having said predetermined frequency; and
a digital/analog converter for providing said compensation signal whose DC level corresponds to a count value of the upper M bits of said N-bit count, where the integer M is equal to or less than the integer N.

3. A voltage/frequency converter according to claim 2, wherein said counter circuit includes:
a first gate circuit for providing a first clock signal by passing said voltage/frequency conversion output for said first given period of time;
a second gate circuit for providing a second clock signal by passing said reference signal for said second given period of time; and
an up/down counter, which performs an up-count operation when said second clock signal is provided but said first clock signal is not, and which performs a down-count operation when said first clock signal is provided but said second clock signal is not, for providing said N-bit count as a result of the up- and down-count operations.

4. A voltage/frequency converter according to claim 3, wherein said combination means includes:
means for adding said compensation signal to said converter input signal.

5. A voltage/frequency converter according to claim 2, wherein said counter circuit includes:
a first gate circuit for providing a first clock signal by passing said voltage/frequency conversion output for said first given period of time;

a second gate circuit for providing a second clock signal by passing said reference signal for said second given period of time; and an up/down counter, which performs a down-count operation when said second clock signal is provided but said first clock signal is not, and which performs an up-count operation when said first clock signal is provided but said second clock signal is not, for providing said N-bit count as a result of the up- and down-count operations.

6. A voltage/frequency converter according to claim 5, wherein said combination means includes:
means for subtracting said compensation signal from said converter input signal.

7. A voltage/frequency converter according to claim 2, wherein said compensator means further includes:
a latch circuit for latching the count value of the upper M bits of said N-bit count by a latch pulse, and providing the latched M-bit data to said digital-/analog converter, said latch pulse being generated in accordance with the lapse of said first and second given periods of time.

8. A voltage/frequency converter according to claim 1, wherein said combination means includes:
an analog circuit, having an operational bias point which is varied with the content of said compensation signal, for amplifying said converter input signal to provide said voltage/frequency conversion input, the DC level of said voltage/frequency conversion input depending on said operational bias point.

9. A voltage/frequency converter according to claim 1, wherein said compensator means includes:
an up/down counter for up-counting said voltage/frequency conversion output, down-counting a reference signal having said reference frequency, and providing a count output corresponding to said compensation signal.

10. A voltage/frequency converter according to claim 1, wherein said compensator means includes:
an up/down counter for down-counting said voltage/frequency conversion output, up-counting a reference signal having said reference frequency, and providing a count output corresponding to said compensation signal.

11. A voltage/frequency converter according to claim 9, wherein said combination means includes:
means for subtracting said compensation signal from said converter input signal.

12. A voltage/frequency converter according to claim 10, wherein said combination means includes:
means for adding said compensation signal to said converter input signal.

13. A voltage/frequency converter according to claim 1, wherein said compensator means includes:
a presettable down-counter, to which predetermined data is preset for each predetermined period of time, for down-counting said voltage/frequency conversion output after completing the preset of said predetermined data, and providing a count output representing the difference between a frequence corresponding to said predetermined data and the frequency of said voltage/frequency conversion output.

14. A voltage/frequency converter according to claim 13, wherein said compensator means further includes:

means for modifying the count output from said presettable down-counter by predetermined compensation data, so that said count output is converted into said compensation signal.

15. A voltage/frequency converter according to claim 13, wherein said compensator means further includes:
means for supplying a preset pulse to said presettable down-counter for every first cyclic period of time, and generating a latch pulse for every second cyclic period of time which is synchronized to said first cyclic period of time;
means for latching the content of said count output according to said latch pulse, and providing, as a result of the latching, a preliminary compensation signal corresponding to said count output; and
means for modifying said preliminary compensation signal by predetermined compensation data to provide said compensation signal.

16. A voltage/frequency converter according to claim 1, wherein said compensator means includes:
computer means, having a function of detecting a frequency difference between the frequency of said voltage/frequency conversion output and said reference frequency, for providing said compensation signal having a magnitude corresponding to said frequency difference when the magnitude of said compensation signal exceeds a predetermined value, and, when the magnitude of said compensation signal falls under said predetermined value, setting the magnitude of said compensation signal at a fixed value depending on the magnitude of said compensation signal.

17. A voltage/frequency converter according to claim 1, wherein said compensator means includes:
computer means, having a function of providing a count which is incremented by either one of said voltage/frequency conversion output and a reference signal having said reference frequency and which is decremented by the other, for providing said compensation signal representing a result of count of said incrementing and decrementing when said result of count exceeds a predetermined value, and, when said result of count is smaller than said predetermined value, setting the magnitude of said compensation signal at a fixed value which corresponds to said result of count.

18. A voltage/frequency converter comprising:
voltage/frequency converter means for generating a voltage/frequency conversion output having a frequency corresponding to the potential of a voltage/frequency conversion input;
reference signal source means for generating a reference signal having a predetermined reference frequency;
counter means for providing a digital count output which corresponds to the difference between the number of oscillations of said voltage/frequency conversion output, obtained within a predetermined period of time, and the number of oscillations of said reference signal, obtained within said predetermined period of time, said digital count output being incremented by either one of said voltage/frequency conversion output and said reference signal and being decremented by the other;
digital/analog converter means for generating an analog compensation signal having a potential corresponding to said digital count output; and signal mixer means for mixing said compensation signal with an a.c. converter input signal to produce said voltage/frequency conversion input, said converter input signal having an average level equal to zero in the absence of drift, wherein said counter means, digital/analog converter means, signal mixer means and voltage/frequency conversion means constitute a negative feedback loop which compensates both for a frequncy drift of said voltage/frequency conversion output and an average level drift of the converter input signal so that the frequency of said voltage/frequency conversion output follows said reference frequency.

19. A voltage/frequency converter comprising:

voltage/frequency converter means for generating a voltage/frequency conversion output having a frequency corresponding to the potential of a voltage/frequency converter input;

signal generator means for generating a reference signal having a predetermined reference frequency, generating a first latch pulse having a frequency higher than said reference frequency, and generating a second latch pulse synchronized to but having a different generation timing from said first latch pulse;

first latch means for latching the signal level of said voltage/frequency conversion output by said first latch pulse to provide a first count signal;

second latch means for latching the signal level of said reference signal by said second latch pulse to provide a second count signal;

counter means for providing a digital count output which corresponds to the difference between the number of oscillations of said first count signal and the number of oscillations of said second count signal, said digital count output being incremented by either one of said first and second count signals and being decremented by the other;

digital/analog converter means for converting said digital count output into an analog compensation signal having a potential corresponding to the content of said digital count output; and signal mixer means for mixing said analog compensation signal with an a.c. converter input signal to produce said voltage/frequency conversion input, said converter input signal having an average level equal to zero in the absence of drift, wherein said counter means, digital/analog converter means, signal mixer means, first and second latch means and voltage/frequency converter means constitute a negative feedback loop which compensates both for a frequency drift of said voltage-frequency conversion output and an average level drift of the converter input signal so that the frequency of said voltage/frequency conversion output follows said reference frequency.

20. A voltage/frequency converter comprising:

voltage/frequency converter means for generating a voltage/frequency conversion output having a frequency corresponding to a voltage/frequency conversion input;

compensator means for providing a compensation signal corresponding to the difference between a predetermined reference frequency and the frequency of said voltage/frequency conversion output; and combination means for combining said compensation signal with a converter input signal to generate said voltage/frequency conversion input, a time constant of amplitude change of said compensation signal being far larger than that of said converter input signal, wherein said voltage/frequency converter means responds of the component to said compensation signal contained in said voltage/frequency conversion input, so that the frequency of said voltage/frequency conversion output is compensated for by said compensation signal such that said voltage/frequency conversion output follows said predetermined reference frequency.

21. A voltage/frequency converter comprising:

voltage/frequency converter means for generating a voltage/frequency conversion output having a frequency corresponding to the potential of a voltage/frequency conversion input;

reference signal source means for generating a reference signal having a predetermined reference frequency;

counter means for providing a digital count output which corresponds to the difference between the number of oscillations of said voltage/frequency conversion output, obtained within a predetermined period of time, and the number of oscillations of said reference signal, obtained within said predetermined period of time, said digital count output being incremented by either one of said voltage/frequency conversion output and said reference signal and being decremented by the other;

digital/analog converter means for generating an analog compensation signal having a potential corresponding to said digital count output; and signal mixer means for mixing said compensation signal with a converter input signal to produce said voltage/frequency conversion input, a time constant of amplitude change of said compensation signal being far larger than that of said converter input signal, wherein said counter means, digital/analog converter means, signal mixer means and voltage/frequency conversion means constitute a negative feedback loop which compensates for a frequency drift of said voltage/frequency conversion output so that said voltage/frequency conversion output follows said reference frequency.

22. A voltage/frequency converter comprising:

voltage/frequency converter means for generating a voltage/frequency conversion output having a frequency corresponding to the potential of a voltage/frequency converter input;

signal generator means for generating a reference signal having a predetermined reference frequency, generating a first latch pulse having a frequency higher than said reference frequency, and generating a second latch pulse synchronized to but having a different generation timing from said first latch pulse;

first latch means for latching the signal level of said voltage/frequency conversion output by said first latch pulse to provide a first count signal;

second latch means for latching the signal level of said reference signal by said second latch pulse to provide a second count signal;

counter means for providing a digital count output which corresponds to the difference between the number of oscillations of said first count signal and the number of oscillations of said second count signal, said digital count output being incremented by either one of said first and second count signals and being decremented by the other;

digital/analog converter means for converting said digital count output into an analog compensation signal having a potential corresponding to the content of said digital count output; and signal mixer means for mixing said analog compensation signal with a converter input signal to produce said voltage/frequency conversion input, a time constant of amplitude change of said compensation signal being far larger than that of said converter input signal, wherein said counter means, digital/analog converter means, signal mixer means, first and second latch means and voltage/frequency converter means constitute a negative feedback loop which compensates for a frequency drift of said voltage/frequency conversion output so that said voltage/frequency conversion output follows said reference frequency.

* * * * *